(12) United States Patent
Nakamura

(10) Patent No.: US 7,061,286 B2
(45) Date of Patent: Jun. 13, 2006

(54) SYNCHRONIZATION BETWEEN LOW FREQUENCY AND HIGH FREQUENCY DIGITAL SIGNALS

(75) Inventor: Atsushi Nakamura, Kumamoto (JP)

(73) Assignee: Teradyne, Inc., Boston, MA (US)

( * ) Notice: Subject to any disclaimer, the term of this patent is extended or adjusted under 35 U.S.C. 154(b) by 16 days.

(21) Appl. No.: 10/875,865

(22) Filed: Jun. 24, 2004

(65) Prior Publication Data

US 2005/0285640 A1    Dec. 29, 2005

(51) Int. Cl.
*H03L 7/00* (2006.01)
(52) U.S. Cl. ....................... 327/145; 375/354
(58) Field of Classification Search ............ 327/144, 327/145
See application file for complete search history.

(56) References Cited

U.S. PATENT DOCUMENTS

| | | | | |
|---|---|---|---|---|
| 4,059,842 A | * | 11/1977 | Meacham | 348/524 |
| 4,110,701 A | * | 8/1978 | Medwin | 331/1 A |
| 5,256,912 A | * | 10/1993 | Rios | 327/144 |
| 5,510,732 A | * | 4/1996 | Sandhu | 326/94 |
| 5,588,004 A | * | 12/1996 | Suzuki et al. | 370/516 |
| 6,188,253 B1 | | 2/2001 | Gage et al. | |
| 6,359,479 B1 | * | 3/2002 | Oprescu | 327/141 |

* cited by examiner

*Primary Examiner*—Minh Nguyen
(74) *Attorney, Agent, or Firm*—Wolf, Greenfield & Sacks, P.C.

(57) ABSTRACT

A synchronization circuit for synchronizing low frequency digital circuitry and high frequency digital circuitry. The synchronization circuit produces an ordered series of clocks from the high-frequency digital clock. The clocks have a deterministic time relationship, with at least one clock having a period longer than the timing uncertainty associated with a synchronization signal. The synchronization signal is passed through a chain of latches, each one clocked by one of the divided down clocks with successively higher frequency. These latches align the synchronization signal with the clocks produced by the clock divider, ultimately aligning the synchronization signal with the high frequency clock. This synchronization circuit is described in connection with automatic test equipment used in the manufacture of semiconductor devices.

17 Claims, 4 Drawing Sheets

SYNCHRONIZATION BETWEEN LOW FREQUENCY AND HIGH FREQUENCY DIGITAL SIGNALS

BACKGROUND OF INVENTION

1. Field of the Invention

This invention relates generally to digital logic circuits and more specifically to synchronization between digital logic circuits operating at different clock rates.

2. Discussion of Related Art

Most modern digital systems use clocks to control the time of operation of the various circuit components within the system. In designing the digital system, care is taken to ensure that whenever one circuit element is clocked to perform an operation, the inputs to that circuit element required to complete that operation have already been generated. In this way, all of the circuit elements can operate together to produce the expected result.

Some complex systems include multiple clocks. Each clock might control the timing of operations within some subset of the circuit elements in the overall system. These subsets of elements are often called "clock domains." Multiple clock domains might be used, for example, where some portions of the system perform high frequency measurements or high speed signal processing. These portions of the system might require a relatively high frequency clock. Other portions of the system might perform relatively low frequency control functions and therefore be implemented with less expensive logic clocked with a lower frequency clock.

Automatic test equipment of the type used to test semiconductor devices during their manufacture is one example of a type of system having multiple clock domains. FIG. 1 shows in block diagram form a piece of automatic test equipment, referred to generally as a "tester." Tester 20 includes a computer workstation 22, which serves as an operator interface and provides overall control to tester 20.

Tester 20 includes a test head 24 that contains many electronic circuit cards that contain circuitry to perform the many functions required for a tester 20 to generate and measure all of the signals necessary to test a semiconductor device under test (DUT) 90.

Tester 20 is shown to contain multiple instrument cards 30. The instrument cards contain circuitry to generate or measure signals as needed during a test of a semiconductor device. Instrument card 30A is an example of a digital instrument card that generates and measures digital signals as part of a test. Card 30A includes a clock module 40 that generates a clock that times circuitry on instrument card 30A. Clock module 40 might be a clock module such as is described in U.S. Pat. No. 6,188,253 to Gage et al., entitled ANALOG CLOCK MODULE, which is hereby incorporated by reference in its entirety.

In the example of FIG. 1, clock module 40 contains a direct digital synthesis (DDS) circuit 42 and a phase lock loop and filter circuit 44. The phase lock loop and filter circuit 44 outputs a clock signal that has a programmable frequency. The frequency of the clock produced by clock module 40 is preferably programmed to execute test functions at a rate appropriate for a specific device under test. Each of the other instruments 30 might similarly contain a clock module 40, with each being programmed to generate a clock at a frequency appropriate for the test functions to be performed by that instrument.

The digital instrument card 30A also includes formatting and PIN electronics 48, which generate and measure digital signals applied to a device under test (DUT) 90. The value of those signals and the precise time at which they are applied to DUT 90 is controlled by programming of pattern generation and timing circuitry 46.

Tester 20 might include multiple digital instruments so that many digital signals can be generated and measured simultaneously. Others of the instruments 30 will perform different functions. Many semiconductor devices generate or operate on analog signals. For example, the semiconductor chips used in disk drive controllers, cellular telephones and audio-video systems all generate or operate on signals in analog form in addition to signals that are in digital form. To test these chips, some of the instruments 30 will generate or measure analog signals.

To fully test DUT 90, it is usually necessary to ascertain that DUT 90 generates a specific analog signal in response to a specific digital input or that DUT 90 generates a specific digital output in response to a certain analog input signal. Often, it is not sufficient to know only that DUT 90 generated an analog or digital signal with the expected value. It is often necessary to also know that the signal was generated at the appropriate time relative to the input. Therefore, it is often necessary that the various instruments 30 within tester 20 be synchronized with each other.

In this context, "synchronized" means that the instruments produce some signals with a predictable time relationship. Often, in a test system, it is not necessary that events in different instruments occur simultaneously and "synchronized" events need not be "simultaneous." Rather, it is often more important in a test system that certain events occur with the same relative time whenever a test is performed. If the test system does not generate signals with the same relative timing on each test, differences in the test results might be attributable to differences in the way test signals were generated or measured rather than actual differences in the device under test. On the other hand, if events have a predictable time relationship, differences from test to test can be more readily associated with defects in the device under test, resulting in a more accurate tester. Additionally, if two events have a predictable time relationship that can be measured, the tester can often be calibrated such that the events occur with a controlled time relationship. However, "synchronous" does not necessarily imply that the relative time of two events is controlled to have a specific value.

FIG. 1 shows that tester 20 includes various region cards 28. Each region card 28 is connected to multiple instrument cards 30. The region card provides a reference clock signal and a synchronization signal to the various instruments 30 connected to that region card. All of the region cards 28 receive a reference clock from a reference clock generator 34 which is located on a master region card 26. This reference clock is fanned out to each of the instrument cards 30 in a region through reference clock fan out circuit 38 on each of the region cards 28. Likewise, a synchronization signal generated in master region card 26 is distributed to each of the region cards 28 and fanned out in synchronization signal fan out circuitry 36 to the instrument cards 30 within that region.

Various other synchronization schemes might be used within a tester. For example, connections might be provided from instrument to instrument through which specific instruments might be synchronized. Generally, though, when multiple instruments have access to a synchronization signal, they can all set a time reference and operate to control events relative to that time reference.

We have recognized that it is particularly challenging to synchronize low frequency digital circuitry with high frequency digital circuitry. As with tester 20 in FIG. 1, the reference clock generally needs to be a low frequency clock because a high frequency clock can not maintain its accuracy as it is routed through a tester. High frequency clocks are generated, such as in a clock generation module 40.

FIG. 2 is a generic block diagram that represents a scenario in which digital circuitry 210 in a low frequency clock domain needs to be synchronized with digital circuitry 212 in a high frequency clock domain. FIG. 2 shows in general the low frequency clock denoted LF_CLK and the high frequency clock HF_CLK. A synchronization signal, denoted SYNC is generated in low frequency digital circuitry 210. FIG. 2 shows the low frequency clock and high frequency clock signals in idealized form. Each period of the clock is shown to be perfectly uniform and the periods are perfectly spaced. However, all clock signals have some amount of jitter.

FIG. 3 illustrates a difficulty that can occur when a synchronization signal, SYNC, that is intended to synchronize high frequency digital circuitry 212 with low frequency digital circuitry 210 is aligned with the low frequency clock, LF_CLK. SYNC pulse 310 has nominal edges 312 and 314. However, LF_CLK has jitter, meaning that the actual position of the leading and trailing edges of SYNC pulse 310 might occur earlier or later than the nominal positions. The leading edge of the SYNC pulse 310 might occur between 312A and 312B. The trailing edge of SYNC pulse 310 might occur between times 314A and 314B. The differences between time 312A and 312B in between times 314A and 314B represents the jitter, J, in LF_CLK.

If SYNC pulse 310 is used to synchronize high frequency digital circuitry 212, the variation in the leading edge 312 or falling edge 314 of the SYNC pulse translates into variability of the timing of the output signal from high frequency digital circuitry 212.

Signal 320A represents an output of high frequency digital circuitry 212 that is synchronized to SYNC pulse 310 that might occur in one run of a test program. Signal 320A depicts an output of circuitry clocked by HF_CLK performing some function in the interval between the leading and trailing edge of SYNC pulse 310. For example, a high frequency signal might be transmitted during this interval.

HF_CLK is a higher frequency signal than LF_CLK used for timing SYNC pulse 310. It therefore has multiple periods in the interval spanned by SYNC pulse 310. Signal 320A is shown to have multiple signal transitions corresponding to the periods of HF_CLK. One of these signal transitions is shown at 322A to be aligned with the nominal rising edge 312 of SYNC pulse 310. If the rising edge of SYNC pulse 310 occurs at the nominal time as indicated by edge 312, the output signal of high frequency digital circuit 212 will have the timing as indicated at 322A. However, if jitter on signal 310 causes the leading edge of SYNC pulse 310 to occur at 312A, the output of high frequency digital logic 212 will appear as shown as signal 320B. In signal 320B signal transition 322B aligns with leading edge 312A.

A similar difference in timing can occur when the high frequency digital logic 212 is synchronized with the falling edge of SYNC pulse 310. The falling edge might occur at any time in the interval bounded by 314A and 314B. Signal 320A shows the output when the falling edge of SYNC pulse 310 occurs at 314A. In contrast, signal 320B denotes the output when the falling edge of SYNC pulse 310 occurs as late as 314B.

Pulses in high frequency digital circuit 212 synchronized to the leading and falling edges of SYNC pulse 310 will occur at some time during the intervals denoted E. Because jitter is random, the precise time within that interval cannot be known from cycle to cycle. Further, because the jitter need not be the same on both the rising and falling edges of SYNC pulse 310, the relative timing of events within high frequency digital logic circuit 212 might be impacted by the jitter. Consequently, there might be a difference from test to test in the timing of an event in the output of high frequency digital logic 212. In the example where a signal is generated in the interval between the leading and trailing edges of SYNC pulse 310, that signal might be generated for an interval $I_A$ as shown in signal 320A or interval $I_B$ as shown in signal 320B. Which interval will occur in any specific test will depend on the jitter on LF_CLK, which is generally unpredictable.

Such differences in timing can lead to undesirable results in the operation of high frequency digital logic 212. Uncertainty in the relative timing of events might cause unpredictable test results, or even errors in operation of high frequency logic 212.

SUMMARY OF INVENTION

The invention relates to improved synchronization between low frequency and high frequency circuitry.

In one aspect, the invention relates to circuitry that has a first sub-circuit clocked with a first clock and having a synchronization output. The circuitry includes a second sub-circuit, clocked with a second clock having a frequency greater than the first clock, the second sub-circuit having a synchronization input. A synchronization circuit has an input coupled to the synchronization output of the first sub-circuit and an output coupled to the synchronization input of the second sub-circuit and a clock input coupled to the second clock. The synchronization circuit has a clock divider that has a longer period than the second clock. The synchronization circuit also includes a latch with a data input and a data output and a clock input, the clock input coupled to the divided clock and the data input coupled to the synchronization output of the first sub-circuit.

In another aspect, the invention relates to circuitry with a first sub-circuit clocked with a first clock and producing a synchronization output and a second sub-circuit, clocked with a second clock, the second sub-circuit having a synchronization input. It includes a synchronization circuit that has clock divider circuitry providing a plurality of ordered clocks synchronized relative to the second clock, the plurality of ordered clocks having an order such that each clock has a longer period than the clock prior to it in the order. It includes a plurality of latches, each latch having a data input and a data output and a clock input. Within this circuit, the plurality of latches have an order with the clock input of each latch coupled to one of the plurality of ordered clocks with each of the plurality of latches and the ordered clock coupled thereto having the same relative position in their respective orders. The data input of the last latch in the order is coupled to the synchronization output of the first sub-circuit and a data input of every other latch in the order is coupled to the data output of the next latch in the order. Also, the data output of the first latch in the order is coupled to the synchronization input of the second sub-circuit.

In yet a further aspect, the invention relates to a method of synchronizing a first sub-circuit, clocked with a first clock, with a second sub-circuit, clocked with a second clock. In this method, a plurality of clocks are generated from the second clock, individual ones of the plurality of clocks being synchronized with the second clock and having a period different than the period of the second clock. A synchronization signal is generated for the first sub-circuit, the synchronization signal having jitter associated therewith. The synchronization signal is aligned with one of the plurality of clocks having a period longer than the magnitude of the jitter associated with the synchronization signal. Thereafter, the synchronization signal is aligned with the second clock. The second sub-circuit is synchronized with the synchronization signal after it has been aligned with the second clock.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
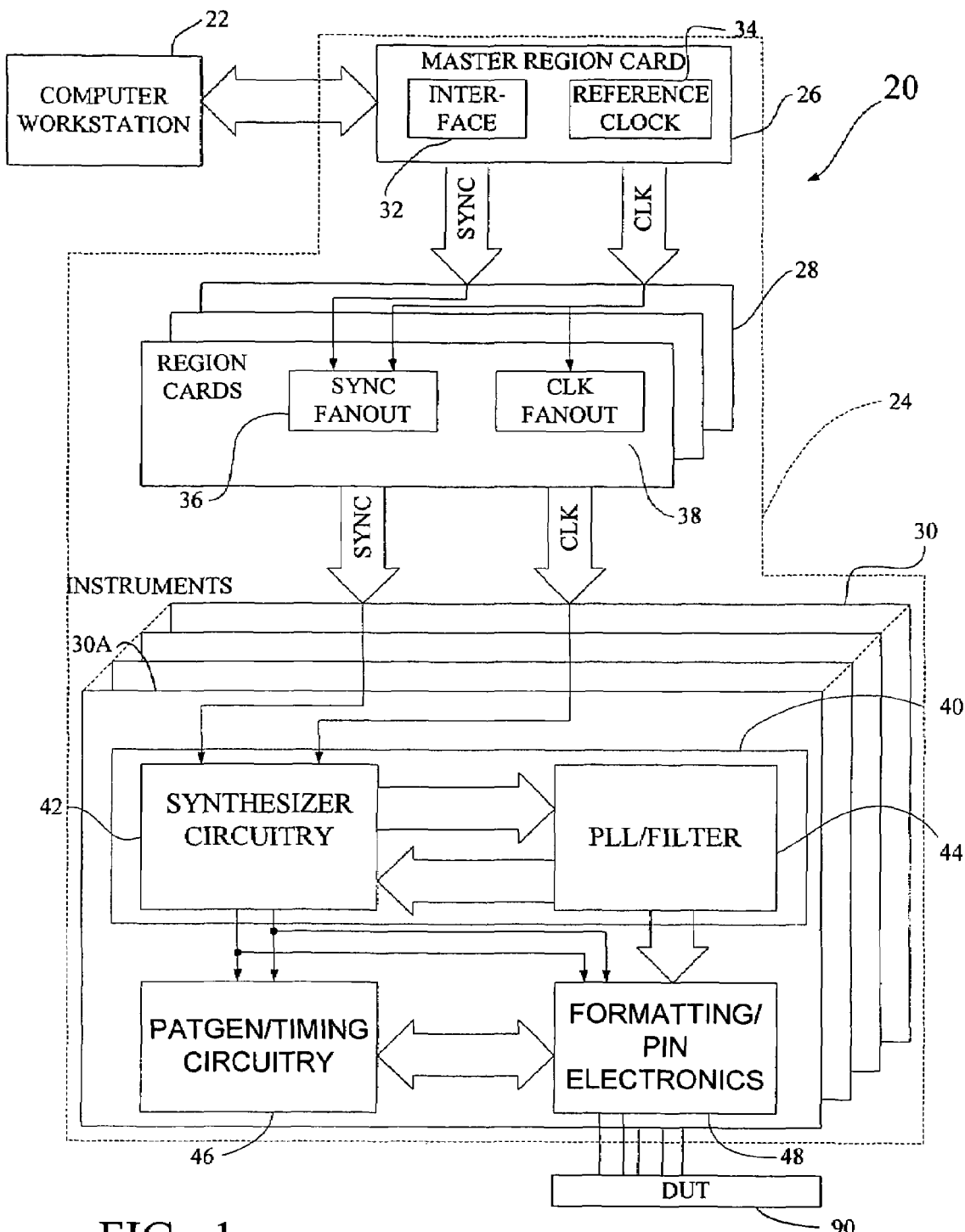
FIG. 1 is a block diagram of automatic test equipment according to the prior art.
Figure 2:
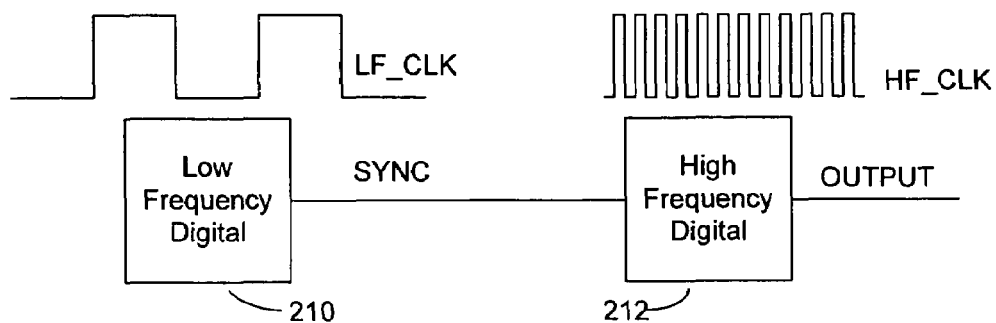
FIG. 2 is a sketch useful in understanding synchronization between low frequency digital circuitry and high frequency digital circuitry.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 4:
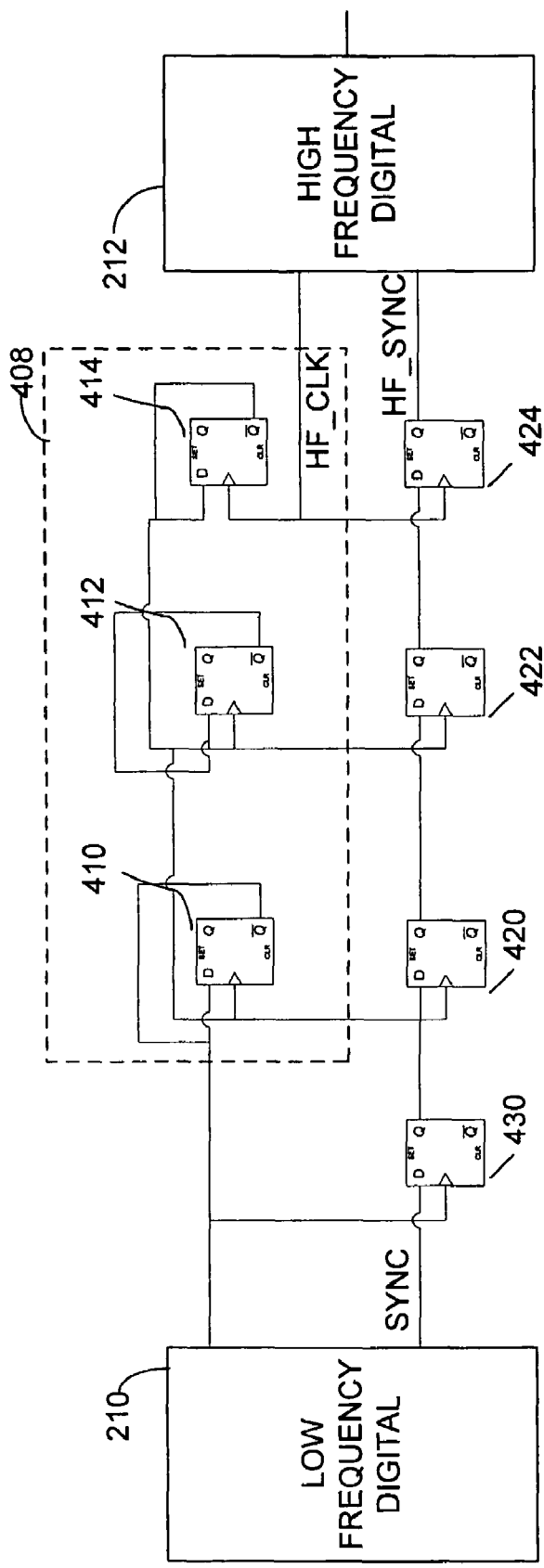
FIG. 4 is a sketch of a synchronization circuit according to an embodiment of the invention.

FIG. 4 shows a synchronization circuit 400 connected between low frequency digital circuitry 210 and high frequency digital circuitry 212. Digital circuits 210 and 212 might represent different instruments in a tester. For example, low frequency digital circuit 210 might be a pattern generator that sends a sequence of commands specifying test operations that are to be performed. High frequency digital circuit 212 might be an analog instrument that generates AC signals using direct digital synthesis. These AC signals might have characteristics specified by the commands from the pattern generator.

Low frequency digital circuit 210 might be clocked by LF_CLK and high frequency digital circuit 212 might be clocked by HF_CLK with a higher frequency. The specific frequencies of LF_CLK and HF_CLK are not critical to the invention. However, in contemplated embodiments, LF_CLK has a frequency less than 200 MHz and HF_CLK has a frequency above 500 MHz.

High frequency digital circuitry 212 provides HF_CLK serves as an input to synchronization circuit 400. Low frequency digital circuit 210 produces a SYNC signal as in the prior art. Synchronization circuit 400 produces as an output HF_SYNC that is provided to high frequency digital circuitry 212. HF_SYNC is derived from the SYNC signal but is timed relative to HF_CLK with a timing that is repeatable even if there is jitter on the SYNC signal. High frequency digital circuit 212 synchronizes its operation to the signal HF_SYNC in the same way that prior art circuitry responded to the signal SYNC.

Within synchronization circuit 400, HF_CLK is supplied to a clock divider circuit 400. Clock divider 400 produces a series of clock signals each of which is synchronized to HF_CLK, but divided down to a successively lower frequency. In the illustrated embodiment, clock divider circuit 408 is made from a chain of D-TYPE flip-flops, each configured as a one half clock divider.

Taking D-TYPE flip-flop 414 as representative, the input clock is provided to the clock input of D-TYPE flip-flop 414. The inverting output of D-TYPE flip-flop 414 is routed back to its input. For each rising edge of the input clock, the state of D-TYPE flip-flop 414 toggles. Thus, the output of D-TYPE flip-flop 414 makes one complete cycle for every two cycles of the input clock. The value on the output of flip-flop 414 therefore represents a clock at one half the frequency of HF_CLK, and might be termed ½ HF_CLK.

The signal at one half the frequency of HF_CLK is provided at the input to the next clock divider in the chain. Flip-flop 412 is configured similarly to flip-flop 414. It takes as an input ½ HF_CLK and produces as an output ¼ HF_CLK. D-TYPE flip-flop 410 is similarly configured as a clock divider. It accepts as an input one quarter HF_CLK and produces as an output ⅛ HF_CLK.

Clock divider 408 is shown to have three stages of clock dividers. A different number of clock dividers might be employed based on the relative frequencies of the HF_CLK and the LF_CLK. Preferably, the final clock divider stage will produce a clock having a period that is longer than the magnitude of the jitter in the SYNC signal.

As used herein, the "magnitude" of jitter refers to the maximum expected variation of the time of a particular signal. The magnitude of the jitter is based on the statistical characteristics of the jitter over some period of time. Because jitter is generally random, at any instant jitter might cause actual deviations in the timing of a particular signal that are smaller or larger than might be predicted by the statistical properties. Various ways are known to characterize the magnitude of jitter.

The output of clock divider 408 is provided to low frequency digital circuitry 210. This divided down clock might serve as the low frequency digital clock. Alternatively, it might be used as a gate on the timing of a SYNC signal produced by the low frequency digital circuit 210. For example, when low frequency digital circuit 210 determines that it should synchronize with high frequency digital circuit 212, it might wait to begin its synchronization operation, including the generation of the SYNC pulse, until it detects an edge of the divided down clock provided by clock divider 408.

The SYNC signal generated by low frequency digital logic 210 is applied to flip-flop 430, which serves as a latch. Latch 430 is clocked by the lowest frequency clock output of clock divider 408. Even if there is jitter on the SYNC signal, latch 430 will appropriately latch the signal the output of flip-flop 430 is provided to flip-flop 420 which also serves as a latch.

Flip-flop 420 is clocked by ¼ HF_CLK from clock divider 408. The output of flip-flop 420 is provided as an input to flip-flop 422, which is clocked by the ½ HF_CLK. The output of flip-flop 422 is in turn provided as an input to flip-flop 424. Flip-flop 424 is clocked by HF_CLK. The output of flip-flop 424 is therefore aligned with HF_CLK, and represents the HF_SYNC signal.

Figure 5:
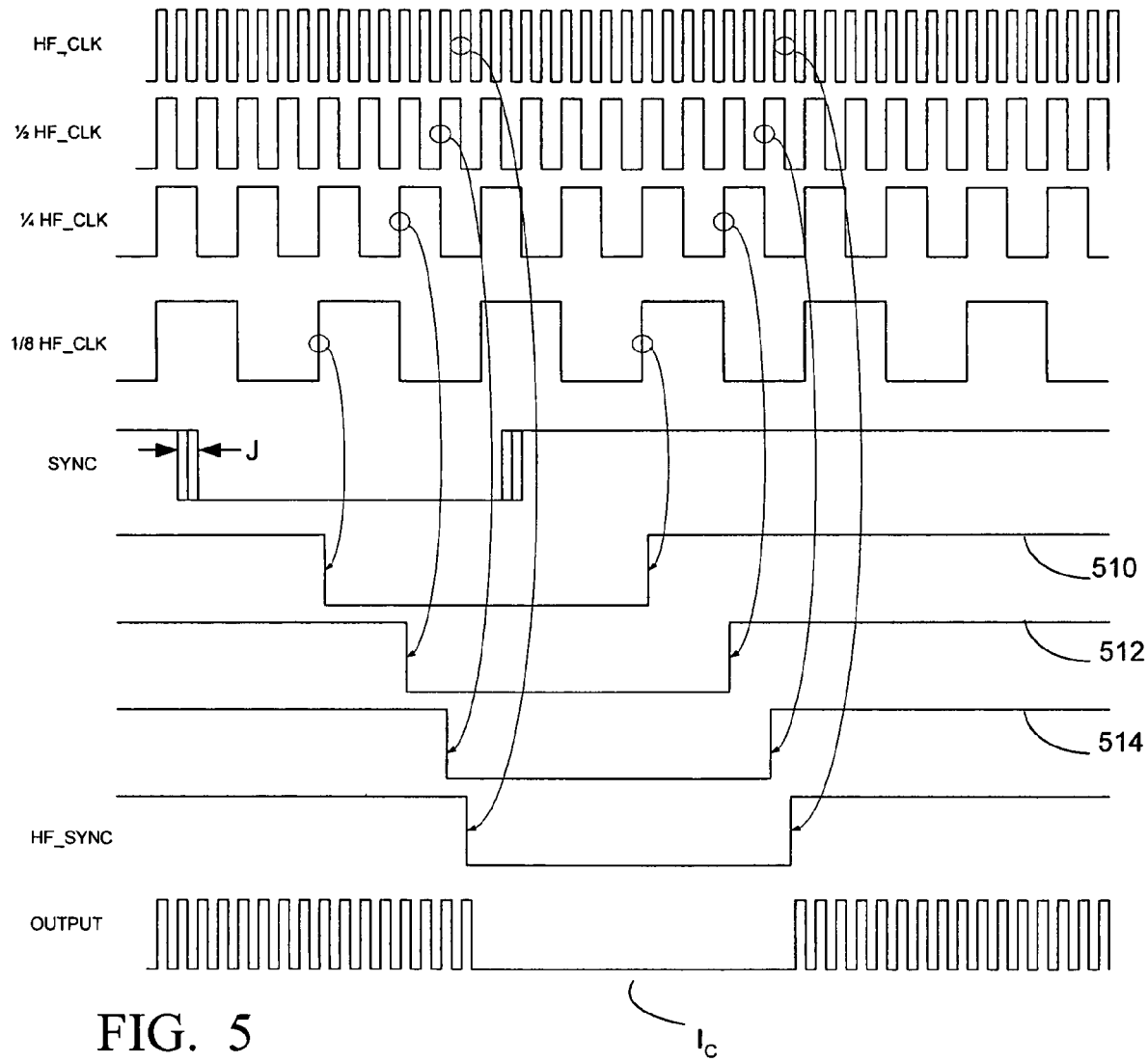
FIG. 5 is a timing diagram useful in understanding the operation of the circuit in FIG. 4.

Operation of the synchronization circuit might be better understood by reference to the timing diagram of FIG. 5. The timing diagram shows the HF_CLK signal and the divided down clocks produced by clock divider 408.

The SYNC signal is shown to be generated at some time during a period of ⅛ HF_CLK. Even when a SYNC signal contains jitter, J, it will occur during the same period of ⅛ HF_CLK because the period of that clock is longer than any timing uncertainty caused by jitter, J. Signal 510 represents the output of flip-flop 430, which is acting as a latch. Signal 510 is the SYNC signal after it has been aligned with ⅛ HF_CLK.

Signal 512 represents signal 510 after it has passed through latch 420. This signal is shown aligned with ¼ HF_CLK. Signal 514 represents signal 512 after it has passed through latch 422. Latch 422 is clocked by ½ HF_CLK. Accordingly this signal is aligned with ½ HF_CLK. The signal HF_SYNC represents signal 514 after it has passed through latch 424. Because this latch is clocked by HF_CLK, the output is aligned with HF_CLK.

Of significance, the signal HF_SYNC will occur with a known timing relationship to HF_CLK. This timing relationship does not change even if there is jitter on the SYNC signal. The same timing relationship would apply if the SYNC signal occurred at any time within the band of uncertainty caused by jitter, J, because the edge of the SYNC signal would, regardless of jitter, fall within the same period of the lowest frequency clock generated by clock divider 408.

Figure 3:
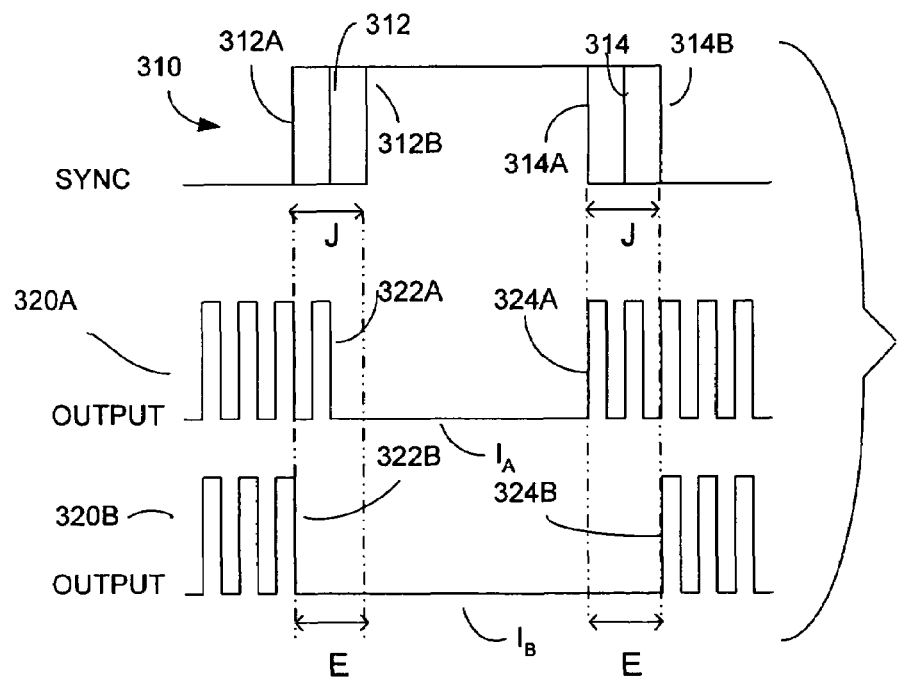
FIG. 3 is a sketch useful in understanding timing uncertainty.

FIG. 5 shows a signal output having an interval $I_C$ bounded by points aligned with the leading and falling edges of the SYNC signal. Despite the presence of jitter on the leading and falling edge of the SYNC signal, the interval $I_C$ will always span the same number of cycles of HF_CLK. In contrast to the intervals such as $I_A$ and $I_B$ shown in FIG. 3, $I_C$ will always have the same duration. In this way, synchronization circuit 400 ensures repeatable performance from high frequency digital logic circuitry 212.

Having thus described several aspects of at least one embodiment of this invention, it is to be appreciated various alterations, modifications, and improvements will readily occur to those skilled in the art.

For example other forms of clock dividers might be used. Also, while it is convenient to make clock dividers that divide the frequency of a clock by two, clock dividers that use other frequency ratios might be used. Additionally, the number of stages in the clock divider chain is for illustration only. The number of stages will preferably depend on the period of HF_CLK relative to the magnitude of the jitter on LF_CLK.

As another example, D-type flip-flops are illustrated as performing a latching function. Any circuit element that can latch an input at a controlled time relative to a clock might be used as a latch.

Further, clock divider 408 has a chain of divider elements that produces multiple clocks that are ordered from highest frequency to lowest frequency. It is not necessary that clocks having this ordering be produced in a chain of circuit elements that is laid out linearly, as pictured. Any convenient layout might be used.

Also, the above described embodiment shows that the high frequency clock at the input to the divider chain is the first clock in the ordered series of clocks. It also shows that every clock generated by the chain of divider elements is connected to a corresponding latch. Where adequate synchronization can be maintained between clocks that differ in frequency by a factor of more than 2, not every clock produced by the clock divider circuit need be connected to a corresponding latch.

Such alterations, modifications, and improvements are intended to be part of this disclosure, and are intended to be within the spirit and scope of the invention. Accordingly, the foregoing description and drawings are by way of example only.

The invention claimed is:

1. Circuitry comprising:
 a) a first sub-circuit clocked with a first clock and having an output;
 b) a second sub-circuit, clocked with a second clock having a frequency greater than the first clock, the second sub-circuit having an input;
 c) a synchronization circuit having an input coupled to the output of the first sub-circuit and an output coupled to the input of the second sub-circuit and a clock input coupled to the second clock, the synchronization circuit comprising:
  i) a clock divider producing a plurality of ordered clocks synchronized relative to the second clock, the plurality of ordered clocks having an order such that each clock has a longer period than the clock prior to it in the order;
  ii) a chain of latches having a data input and a data output and a plurality of clock inputs, each clock input coupled to a clock of the plurality of ordered clocks and the data input coupled to the output of the first sub-circuit.

2. The circuitry of claim 1 wherein the second clock is generated by direct digital synthesis.

3. The circuitry of claim 2 wherein the second clock has a frequency in excess of 500 MHz and the first clock has a frequency less than 200 MHz.

4. Automatic test equipment comprising the circuitry of claim 2 wherein the second sub-circuit is a portion of a high frequency AC instrument.

5. The circuitry of claim 1 wherein the clock divider comprises a chain of divider circuits, each divider circuit having an input and an output, with the input of each successive divider circuit in the chain connected to the output of a prior divider circuit in the chain, each divider circuit outputting a clock with half the frequency at its input, with the input of the first divider circuit in the chain coupled to the second clock.

6. The circuitry of claim 1 wherein the clock divider comprises:
 a) a chain of divider circuits, each divider circuit having an input and an output, with the input of each successive divider circuit in the chain connected to the output of a prior divider circuit in the chain, each divider circuit outputting a clock with half the frequency at its input, with the input of the first divider circuit in the chain coupled to the second clock.

7. The circuitry of claim 6 wherein each of the divider circuits comprises a D-type flip-flop.

8. Circuitry comprising:
 a) a first sub-circuit clocked with a first clock and producing an output;
 b) a second sub-circuit, clocked with a second clock, the second sub-circuit having an input;
 c) a synchronization circuit comprising:
  i) clock divider circuitry providing a plurality of ordered clocks synchronized relative to the second clock, the plurality of ordered clocks having an order such that each clock has a longer period than the clock prior to it in the order;

ii) a plurality of latches, each latch having a data input and a data output and a clock input, wherein:

A) the plurality of latches having an order with the clock input of each latch coupled to one of the plurality of ordered clocks with each of the plurality of latches and the ordered clock coupled thereto having the same relative position in their respective orders;

B) the data input of the last latch in the order is coupled to the output of the first sub-circuit and a data input of every other latch in the order is coupled to the data output of the next latch in the order; and C) the data output of the first latch in the order is coupled to the input of the second sub-circuit.

9. The circuitry of claim 8 wherein the second clock is generated by direct digital synthesis.

10. The circuitry of claim 9 wherein the second clock has a frequency in excess of 500 MHz and the first clock has a frequency less than 200 MHz.

11. Automatic test equipment comprising the circuitry of claim 9 wherein the second sub-circuit is a portion of a high frequency AC instrument.

12. A method of synchronizing a first sub-circuit, clocked with a first clock, with a second sub-circuit, clocked with a second clock comprising:

a) generating a plurality of clocks from the second clock, individual ones of the plurality of clocks being synchronized with the second clock and having a period different than the period of the second clock;

b) generating a signal for the first sub-circuit, the signal having jitter associated therewith;

c) aligning the signal with one of the plurality of clocks having a period longer than the magnitude of the jitter associated with the signal; and d) thereafter aligning the signal with the second clock; and e) synchronizing the second sub-circuit with the signal after it has been aligned with the second clock.

13. The method of synchronizing a first sub-circuit with a second sub-circuit of claim 12 wherein the signal is synchronized to the first clock.

14. A method of manufacturing semiconductor devices employing test equipment having a first sub-circuit and a second sub-circuit, comprising:

a) synchronizing the first sub-circuit and the second sub-circuit in the test equipment according to the method of claim 12;

b) generating test signals with at least one of the first sub-circuit and the second sub-circuit and applying the test signals to semiconductor devices during their manufacture;

c) measuring with the test equipment responses to the test signals from the semiconductor devices; and d) altering the manufacturing operation based on measurements made with the test equipment.

15. The method of synchronizing a first sub-circuit with a second sub-circuit of claim 12 wherein generating a plurality of clocks comprises dividing the second clock.

16. The method of synchronizing a first sub-circuit with a second sub-circuit of claim 12 wherein aligning the signal with one of the plurality of clocks comprises latching the signal in a latch clocked by the one of the plurality of clocks.

17. The method of synchronizing a first sub-circuit with a second sub-circuit of claim 12 wherein aligning the signal with the second clock comprises successively latching the signal in latches clocked by ones of the plurality of clocks.

* * * * *